United States Patent [19]

Frenkil

[11] Patent Number: 5,418,407
[45] Date of Patent: May 23, 1995

[54] ASYNCHRONOUS TO SYNCHRONOUS PARTICULARLY CMOS SYNCHRONIZERS

[75] Inventor: Gerald L. Frenkil, Concord, Mass.

[73] Assignee: VLSI Technology, Inc., San Jose, Calif.

[21] Appl. No.: 268,800

[22] Filed: Jul. 1, 1994

Related U.S. Application Data

[63] Continuation of Ser. No. 854,100, Mar. 19, 1992, abandoned.

[51] Int. Cl.⁶ .................. H03L 7/00; A03K 3/284
[52] U.S. Cl. .................... 327/163; 327/141; 327/185; 327/333
[58] Field of Search ............ 307/272.1, 272.2, 272.3, 307/480, 443, 279, 269, 582, 542.1, 264

[56] References Cited

U.S. PATENT DOCUMENTS

| | | | |
|---|---|---|---|
| 4,103,188 | 7/1978 | Morton | 307/570 |
| 4,544,851 | 10/1985 | Conrad et al. | 307/269 |
| 4,745,302 | 5/1988 | Hanawa et al. | 307/269 |
| 4,796,004 | 1/1989 | Rich et al. | 341/143 |
| 4,851,710 | 7/1989 | Griona | 307/269 |
| 5,122,694 | 6/1992 | Bradford et al. | 307/269 |

FOREIGN PATENT DOCUMENTS

| | | | |
|---|---|---|---|
| 0219846 | 4/1987 | European Pat. Off. | 3/37 |
| 0416576A2 | 3/1991 | European Pat. Off. | 3/37 |

OTHER PUBLICATIONS

Lindsay Kleeman & Antonio Cantoni, "Metastable Behavior in Digital Systems," IEEE Design & Test of Computers, Top-Down Layout for Custom Design Applications of Inverter-Free PLAs, 1987 Annual Index, Dec. 1987, pp. 4–19.
Stoll, How to Avoid Synchronization Problems *VLSI Design*, Nov./Dec. '82, pp. 56–57 and 59.
Kleeman, et al. Metastable Behavior in Digital Systems *IEEE Design and Test of Computers*, Dec. '87, pp. 4–19.
Flannagan, Synchronization Reliability in CMOS Technology *IEEE Journal of Solid State Circuits*, vol. SC-20, No. 4 Aug. 1985; pp. 880–882.
Horstmann, et al. Metastability Behavior of CMOS ASIC Flip-Flops in Theory and Test *IEEE Journal of Solid State Circuits*, vol. 24, No. 1; Feb. 1989; pp. 146–157.
Kim, et al. Metastability of CMOS Latch/Flip-Flop *IEEE Journal of Solid State Circuits*, vol. 25, No. 4; Aug. 1990; pp. 942–951.
Nootbar et al., Minimizing the Effect of Metastability in BiCMOS Circuit Design *EDN* Sep. 8, 1990; pp. 141–146.
Gabara, et al., Metastability of CMOS Master/Slave Flip–Flops *IEEE 1991 Custon Integrated Circuits Conference* pp. 29.4.1–29.4.6.
Masteller, Design a Digital Synchronizaer with a Low Metastable-Failure Rate *EDN* Apr. 25, 1991, pp. 169–174.
Rosenberger, et al., Comments on "Metastability of CMOS Latch/Flip-Flop" *IEEE Journal of Solid State Circuits*, vol. 27, No. 1, Jan. '92.

Primary Examiner—Timothy P. Callahan
Assistant Examiner—Toan Tran
Attorney, Agent, or Firm—Bowles Horton

[57] ABSTRACT

The disclosure concerns asynchronous to synchronous synchronizers and particularly a technique which involves level shifting of a metastable voltage either within a synchronizer stage or between synchronizer stages. In a particular implementation of the invention, this level shifting is achieved by altering the relative proportions of at least one complementary pair of devices in a synchronizer or inserting diodes in order to shift the level of a metastable voltage outside the range of a fatal voltage window possessed or exhibited by an adjacent or following part or stage of the synchronizer. By this means, although the occurrence of a metastable condition cannot be avoided, the likelihood of propagation of the metastable condition throughout the synchronizer may be very significantly reduced.

3 Claims, 5 Drawing Sheets

FIG.1 PRIOR ART
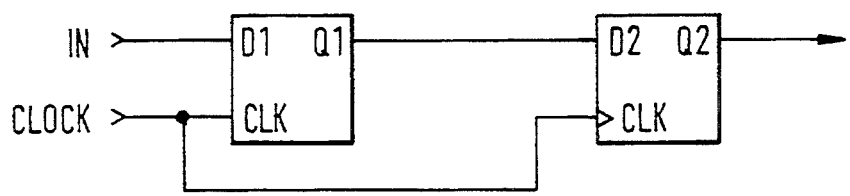
FIG.2 PRIOR ART
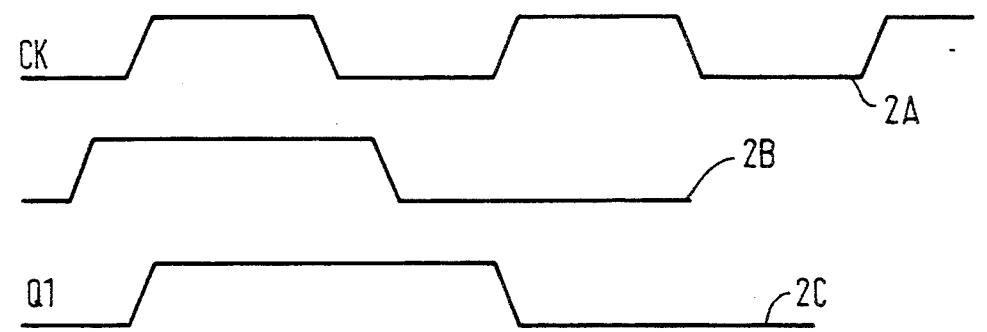
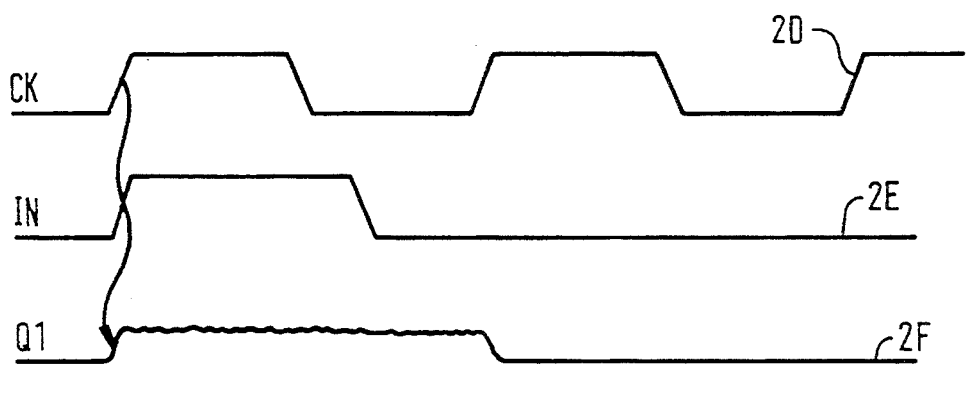
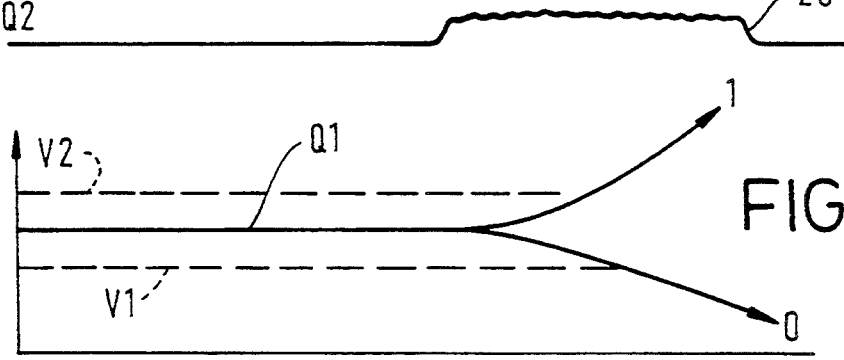
FIG.3

FIG. 4
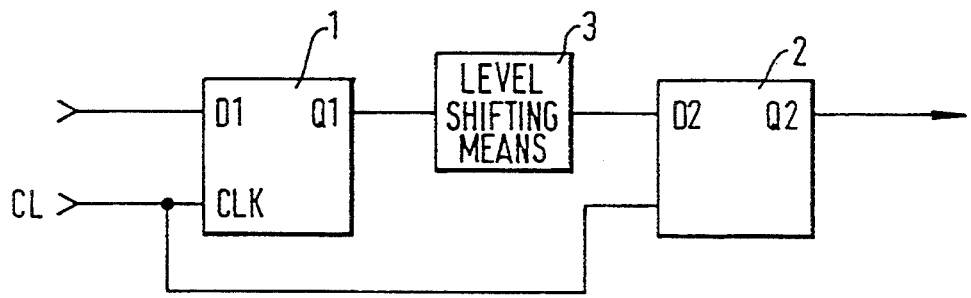
FIG. 5
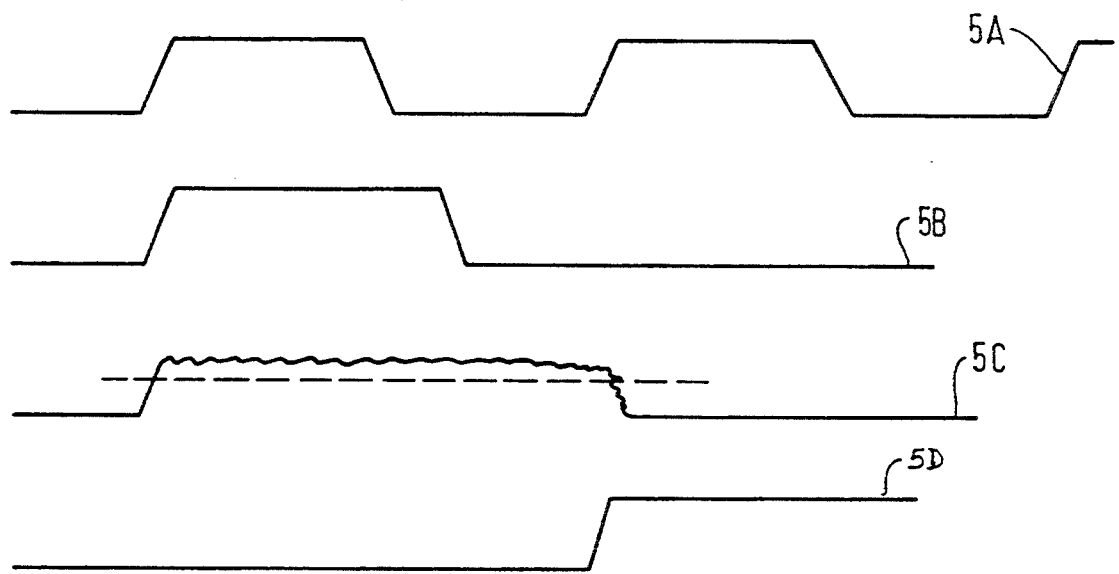
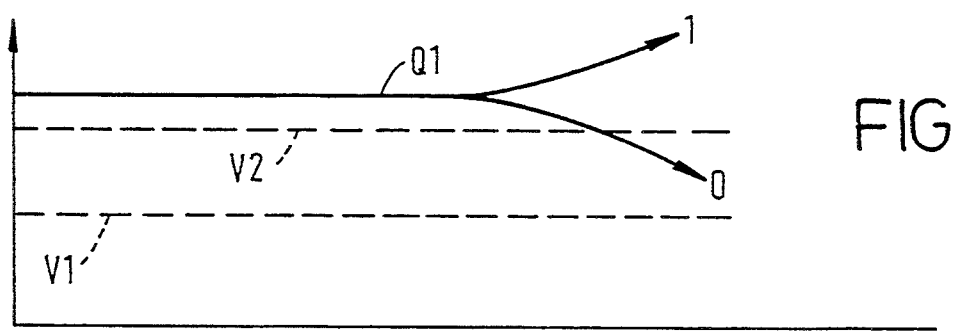
FIG. 6

ASYNCHRONOUS TO SYNCHRONOUS PARTICULARLY CMOS SYNCHRONIZERS

This is a continuation of application Ser. No. 07/854,100, filed Mar. 19, 1992, abandoned.

FIELD OF THE INVENTION

This invention relates to synchronizers employed for receiving digital signals that may be asynchronous relative to a system clock and converting those signals into corresponding synchronous or clocked signals. The invention particularly relates to MOS synchronizers and D-latches and D-flip-flops employed as synchronizers but may be applied to other forms of bistable circuits such as R-S flip-flops.

BACKGROUND OF THE INVENTION

It is well known that the correct operation of synchronous digital circuits requires that, for example, data signals should not exhibit signal transitions within the set up or hold times of circuits which are governed by clock signals that define synchronous operation. If this operational condition is not observed, the phenomenon of metastability arises, wherein for example a bistate circuit does not reach a well-defined logical state (zero or one) within a normal time but instead lingers in an indetermined or metastable state which cannot be unambiguously interpreted by a subsequent circuit. The nature and possible duration of this state is well discussed in the literature, for example by Peter A. Stoll in VLSI Design, November/December 1982, pages 56 to 59 and by Kleeman et al., IEEE Design & Test of Computers, December 1987, pages 4 to 18. As the aforementioned references explain, synchronizers are particular susceptible to metastability by virtue of the particular task they perform, by converting asynchronous data into synchronous data. It is known, for example, to employ a D-flip-flop as a synchronizer. Such a flip-flop is susceptible to a metastable condition if a transition in the asynchronous data occurs at substantially the same time as a relevant clock signal transition.

Various expedients have been proposed to mitigate the incidence of metastability. They include the use of fast devices, extended decision times, a pausable clock, a Schmitt synchronizer and redundancy and masking. These proposals are fully discussed in the references aforementioned and they all have attendant disadvantages.

The object of the present invention is to mitigate the effect of metastability in digital circuits, particularly synchronizers, so as to increase substantially the mean time between failures due to the occurrence of a metastable condition. It is a further object of the present invention to provide specific circuit means which are applicable to CMOS synchronizers and which render those synchronizers less susceptible to metastable failure.

These and other objects of the invention are achieved by a technique which involves level shifting either within a synchronizer stage or between synchronizer stages. In a particular implementation of the invention, this level shifting is achieved by altering the relative proportions of at least one complementary pair of devices in a synchronizer in order to shift the level of a metastable voltage outside the range of a fatal voltage window possessed or exhibited by an adjacent or following part or stage of the synchronizer. By this means, although the occurrence of a metastable condition cannot be avoided, the likelihood of propagation of the metastable condition throughout the synchronizer may be very significantly reduced.

BRIEF DESCRIPTION OF THE DRAWINGS

FIG. 1 illustrates a known form of a two-stage synchronizer.

FIG. 2 is a diagram illustrating schematically graphs of various waveforms that may occur in a synchronizer as represented in FIG. 1.

FIG. 3 is a diagram illustrating the metastable condition.

FIG. 4 is a diagram of a synchronizer which resembles that shown in FIG. 1 but is modified according to the basic concept of the invention.

FIG. 5 is a diagram including graphs of various waveforms that may occur in a synchronizer as represented in FIG. 4.

FIG. 6 is a diagram illustrating one effect of the present invention.

DETAILED DESCRIPTION OF THE INVENTION AND PREFERRED EMBODIMENTS

Figure 7:
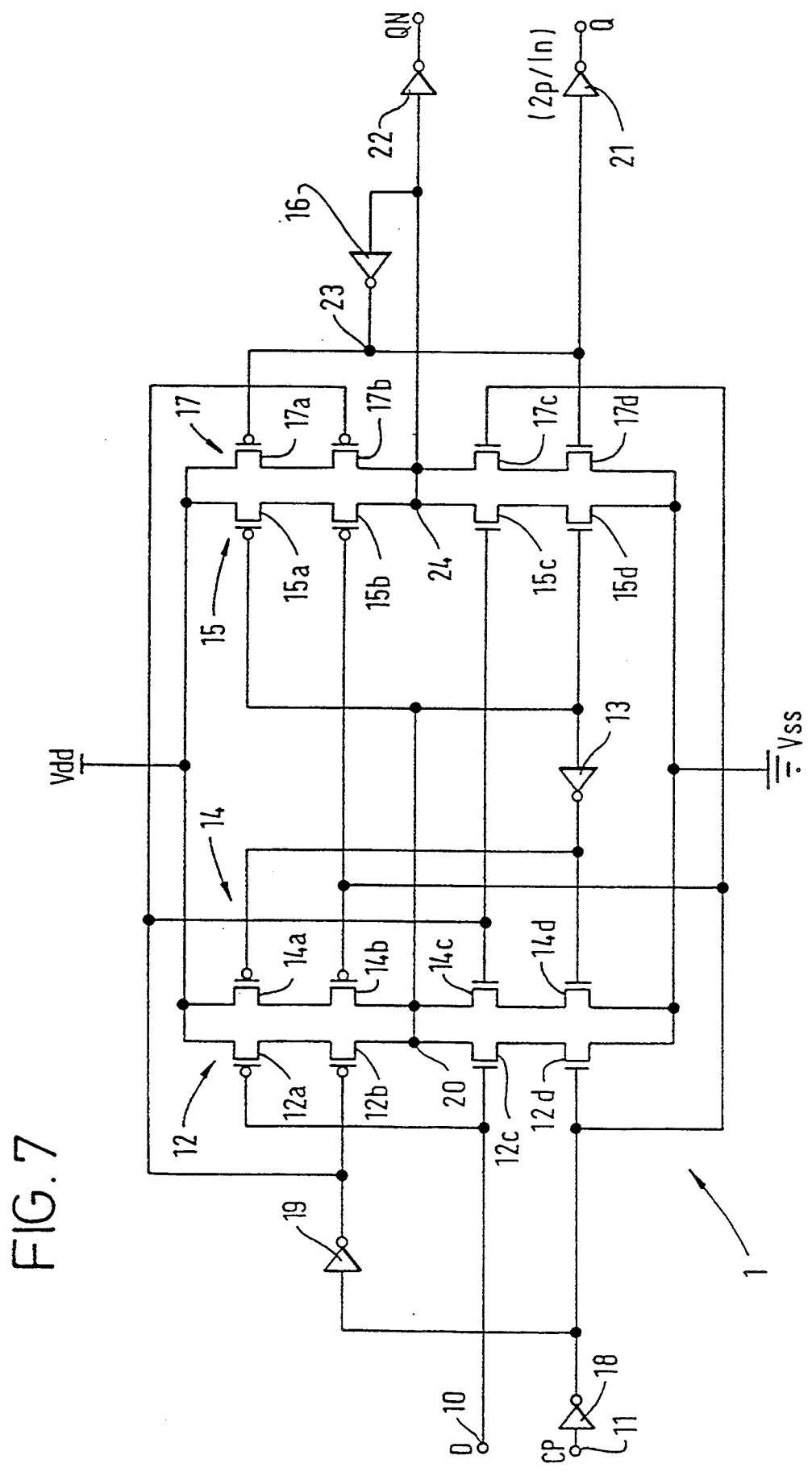
FIG. 7 is a specific schematic diagram illustrating a synchronizer according to the present invention.

FIG. 1 illustrates a typical two-stage synchronizer which is known in the art for converting an asynchronous input data signal into a synchronous data signal for use in a generally synchronously operating digital circuit. The synchronizer comprises two stages which may, for example, be D-flip-flops 1 and 2. The first flip-flop 1 has a data input D1 and a clock input CLK. The direct (Q1) output of the first flip-flop is connected to the data input (D2) of the second flip-flop, which receives a clock input in common with the first flip-flop and samples the output Q1 at times determined by transitions in the clock signal. Synchronizers having more stages than two are known. The idea of providing a multiplicity of stages is to mitigate the effect of metastability occurring in the first stage on the assumption that although the metastable state will endure sometime, the likelihood is that it will not endure for more than one complete clock period. However, such an expedient is insufficient and the metastability can be propagated along the synchronizer, as will be apparent from further description below.

FIG. 2 illustrates schematically various waveforms occurring at various points in the synchronizer shown in FIG. 1. FIG. 2A illustrates the clock signal. FIG. 2B illustrates for the sake of comparison a data signal which has a zero to one transition substantially before the first positive going transition in the clock signal and terminating at a significant time after the falling transition of the clock signal. Such an asynchronous input signal does not give rise to metastability. The Q1 output under these conditions, as shown in FIG. 2C, exhibits a positive going transition (assuming that is the convention of the output) at the time of the positive going transition of the clock signal and a falling transition at the positive going transition in the next clock period.

FIG. 2D again shows the clock signal as represented in FIG. 2A. FIG. 2E illustrates an asynchronous input of which the positive going transition is substantially contemporary with the positive going transition in the first clock period. FIG. 2F illustrates the metastable condition of the output Q1. The output Q1 does not progress to a zero or one but lingers in an intermediate state for a substantial time. FIG. 2G illustrates the propagation of the metastable condition by virtue of the metastability of the output Q2, which likewise lingers between the zero and one states.

FIG. 3 illustrates why the metastable condition can be propagated.

As is illustrated in FIG. 3, one may presume the existence for the second stage of a 'fatal voltage window' defined between a lower voltage level V1 and an upper voltage level V2. The particular voltage levels and the separation between them depend on the particular devices used but in essence define a range of voltages which cannot be logically resolved by a subsequent circuit or stage. In a CMOS circuit the range will normally be centred on an intermediate voltage (Vdd−Vss)/2. FIG. 3 shows the metastable voltage Q1, which persists at some intermediate level within the fatal voltage window of the subsequent stage for a significant time before it eventually resolves to a binary 1 or 0. The metastable condition will be propagated where this metastable condition persists at the time of the next clock transition.

FIG. 3 provides a key to understanding the concept underlying the present invention. According to this concept one may provide a means for producing a shift between the level of the metastable voltage (whatever it may be) and the fatal voltage window of the subsequent stage, so as to translate, or enable interpretation of the metastable voltage as an unambiguous logic level.

Reference should now be made to FIG. 4 in conjunction with FIGS. 5 and 6. The synchronizer in FIG. 4 comprises, as before, two flip-flops 1 and 2 of which the first is adapted to receive an asynchronous data signal at its data input D1 and to provide a synchronous data output Q1 to the data input D2 of the second stage 2, both stages being clocked by a common clock signal. In the circuit of FIG. 4 there is shown schematically a level shifting means 3. This is shown as disposed between the Q1 output of the first stage and the data input D2 of the second stage for convenience of understanding. Although a separate level shifting stage can be contemplated, the level shifting means is preferably incorporated within a bistable stage to avoid the introduction of propagation delay which reduces the time which the first flip-flop has for resolving its metastable condition. FIG. 7, to be described, indicates an implementation of such a level shifting means.

The purpose of the level shifting means may be seen with reference to FIG. 6, wherein the thresholds V1 and V2 again indicate the fatal voltage window of the second stage. It will be seen from FIG. 6 however that owing to the relative level shifting which has occurred, the metastable voltage Q1 is above the upper voltage limit V2 and accordingly even though the metastable condition has not been avoided, it is not propagated to the second bistable switching stage because the second stage will correctly interpret the voltage Q1 as a 'one' signal.

FIG. 5 illustrates the clock waveform 5A, similar to waveform 2A, the data input 5B, resembling waveform 2E, the metastable output Q1 (waveform 5C) and the final output Q2 (waveform 5D), which correctly transitions to a "1" state.

FIG. 7 illustrates a master-slave CMOS flip-flop which may, as shown, be used as the first stage in a multistage synchronizer but which might, as explained with reference to FIG. 9, be used as a single stage synchronizer. The essential difference is that where the invention is applied to a multistate synchronizer the level shifting envisaged by the present invention maybe applied between the stages, for example to a buffer or inverter device disposed between the stages whereas if a single stage synchronizer is employed, the level shifting is preferably applied within the circuit constituting the single stage.

FIG. 7 illustrates, for the sake of example, a master-slave flip-flop which is in fact a cascade of two D-latches. The mode of a D-latch depends on the level of an applied clock signal. Where the clock signal is of one binary value (such as a zero), the output follows (either directly or in complementary fashion) the transitions of the data input; this is the 'transparent' mode. For the other binary value of the clock signal, the circuit is latched, so the changes in the data input alone have no effect on the output. A D-latch is not normally used by itself as a synchronizer, but a D-flip-flop can readily be constructed from a cascade of two D-latches whose transparent and latched modes occur alternately.

Figure 8:
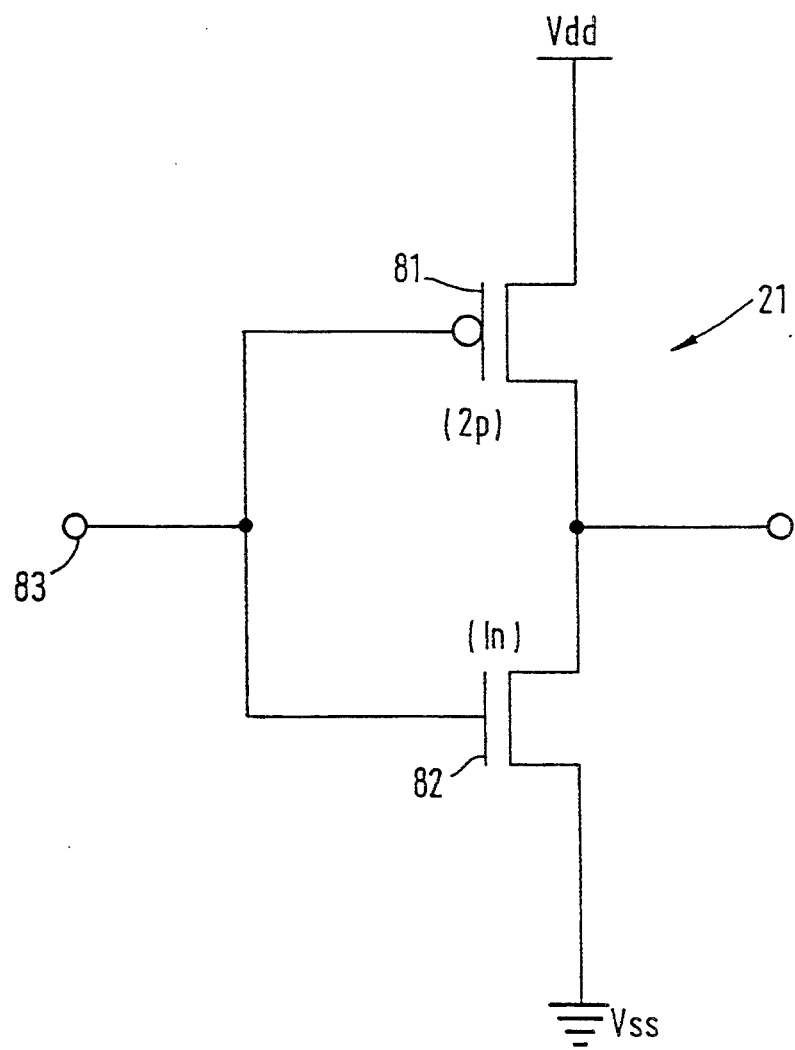
FIG. 8 illustrates a detail of the synchronizer shown in FIG. 7.

The circuit shown in FIG. 7 has input terminals 10 and 11 for the reception of input (asynchronous) data and a clock signal respectively. A first D-type latch is constituted by a feed-forward clocked inverter 12, an inverting buffer 13 and a feedback clocked inverter 14. Likewise a second D-type latch is constituted by a feed-forward clocked inverter 15, an inverting buffer 16 and a clocked feedback inverter 17. Relatively complementary unbuffered outputs appear at output node 23 of the inverting buffer 16 and the common output node 24 of the inverters 15 and 17. These two outputs are buffered by respective output buffers 21 and 22, each of which may be a CMOS inverter as shown in FIG. 8.

Each of the clocked inverters comprises a stack of four transistors between the power rail Vdd and the ground rail vss. In particular, the clocked inverter 12 comprises two complementary transistors, i.e. a p-channel transistor 12a and an n-channel transistor 12c, of which the gates receive the input data signal, a p-channel transistor 12b adjacent and in series with the p-channel transistor 12a and an n-channel transistor adjacent and in series with the n-channel transistor 12c, the transistors 12b and 12d receiving the clock signal and its complement by way of inverters 18 and 19 and byway of inverter 18 respectively. In each clocked inverter, a complementary pair of transistors receive an input signal and a respective pair of series transistors receive relatively complementary versions of the clock signal. Those skilled in the art will readily see that the connections provide for the second latch a transparent mode when the first latch is in its latched mode and vice versa.

If for example the clock signal at terminal 11 is HIGH, the transistors 12b and 12d are not conductive and the output at the central node 20 of the inverters 12 and 14 does not change irrespective of changes in the input D. Suppose that this is LOW (=0) and the input is LOW. When the clock signal goes LOW, transistors 12b and 12d are rendered conductive, as is transistor 12a. The output is driven HIGH regeneratively, because transistors 14c and 14d are driven OFF. A converse action occurs when the input again goes HIGH.

These actions require transitions in the data and clock to be substantially displaced in time. If the clock and data change state at substantially the same times, the voltage at the node 20 will linger in the region of (Vdd−Vss)/2, as will the voltages at the nodes 23 and 24 of the second latch.

The circuit as thus far described has been given by way of example. Other forms of flip-flop employing CMOS devices can be used instead.

In the circuit of FIG. 7, the Q output of the flip-flop is provided by way of the buffer or inverter 21. The QN output is also provided by way of a corresponding buffer or inverter 22. In general, either the Q or the QN output may be coupled to succeeding stages. A typical buffer is shown in FIG. 8 and comprises a generally known form of inverter consisting of a complementary pair comprising a p-channel device 81 and an n-channel device 82 of which the gates are coupled together for reception of a data signal at an input 83.

Normally, the p-channel device and n-channel device in a buffer or inverter of this nature are fabricated so that the balance voltage or the switching level is centered between Vdd and Vss. Typically, the p-channel device has a width approximately 2.5 times that of the n-channel device. If the inverter receives an input voltage which is at an intermediate level, that is to say greater than Vss by more than the threshold voltage of the n-channel device and depressed below the Vdd voltage by more than the drain threshold voltage of the p-channel device, both devices are relatively conductive. When both devices are relatively conductive, there exists a narrow range of input voltage in response to which the output voltage will be metastable. This narrow range is the fatal voltage window previously mentioned. On the assumption that the aforementioned 2.5 to 1 ratio is maintained, the output is approximately half way between the Vdd and Vss reference voltages when the input is within the fatal voltage window.

However, in accordance with the present invention, the voltage output of the inverter can be level shifted so that it is substantially displaced from the fatal voltage window of a subsequent stage and can thereby be interpreted as an unambiguous logic level by a following stage. One way in which this can be achieved is to change the relative ratio of the on resistances of the p-channel and n-channel devices in the buffer. This is conveniently achieved by increasing the p-channel width so that the normal ratio between the p-channel and n-channel widths is from about one and a half times to about twice the normal ratio mentioned above. The effect has already been described with reference to FIGS. 5 and 6. Thus if r is the size ratio (which will normally be used throughout the integrated circuit) that gives a switching point at (Vdd - Vss)/2, the selected ratio will be x*r where x is selected to provide the level shifting and is normally in the region from 1.5 to 2, r normally being approximately 2.5. A corresponding effect could be achieved by reducing the normal size ratio.

The sizing of the output buffer in accordance with the foregoing is shown by the parenthetical legend (2p/1n) in FIG. 7 and by (2p) and (1n) in FIG. 8.

It will be now apparent that a similar effect could be achieved by altering the sizes of transistors 15a and 15b relative to transistors 15c and 15d or the sizes of transistors 17a and 17b relative to transistors 17c and 17d.

It would also be possible to provide a similar relative size change for transistors in the first latch but the asymmetry thereby produced might degrade switching performance in other respects.

Figure 9:
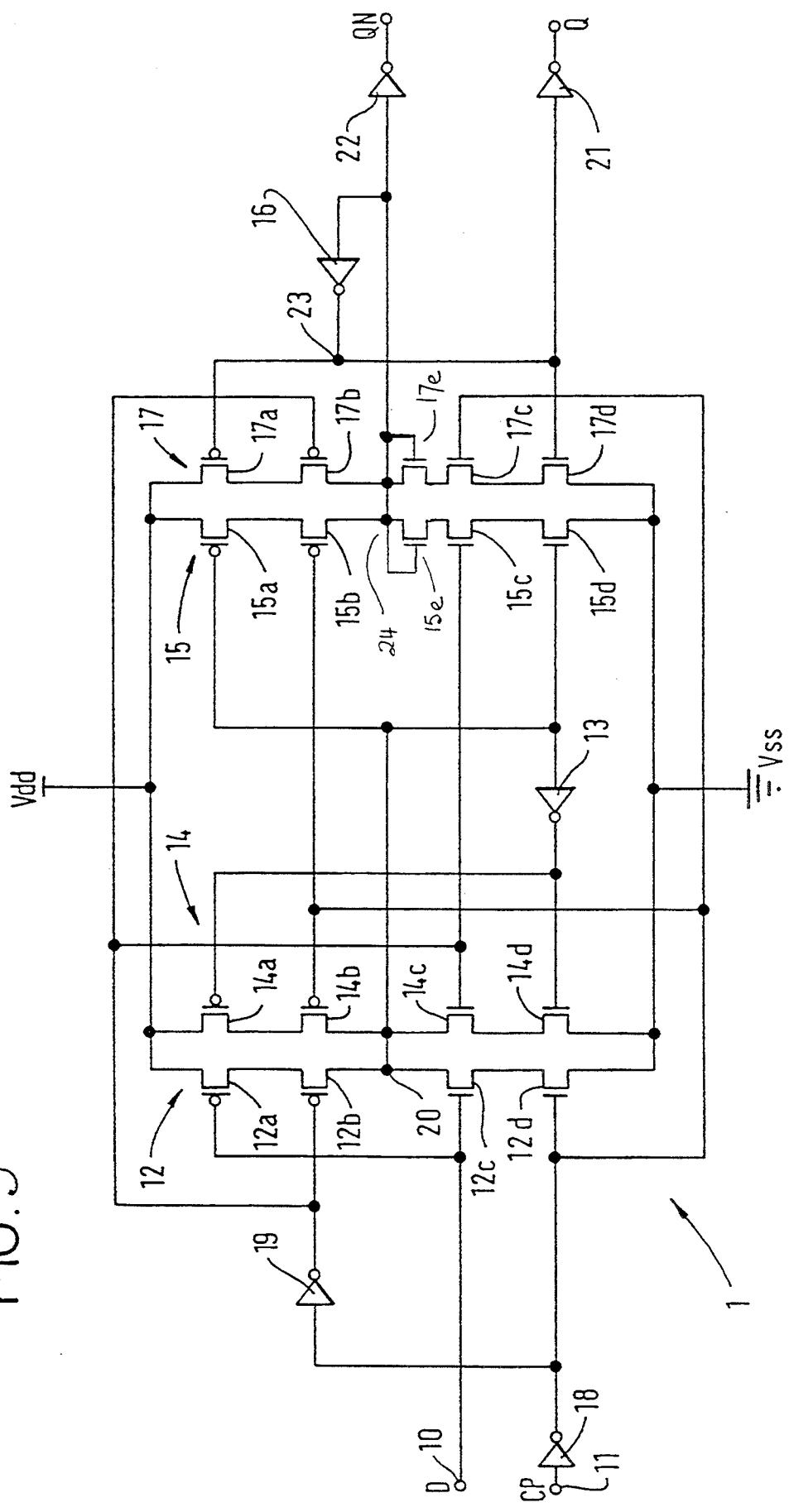
FIG. 9 illustrates a another embodiment of the invention in a synchronizer generally similar to the synchronizer of FIG. 7.

An alternative embodiment of the invention is illustrated by FIG. 9. This embodiment is similar to that in FIG. 7 and accordingly reference should be made to the previous description for an understanding of how the master-slave flip-flop in FIG. 9 operates. In this embodiment however a level shifting of the voltage at the output node 24 is achieved by interposing an additional conductive device between the node and one of the devices connected to it. In particular an additional n-channel transistor 17e is disposed in series between the n-channel transistor 17c and the node 24, the gate of the additional transistor 17e being connected to the node 24. In this particular embodiment, since inverter 15 shares node 24 with the inverter 17, it is preferable for inverter 15 to include an additional transistor 15e likewise, this transistor being disposed in series between transistor 15c and the node 24. The gate of the transistor is connected to the node 24.

Other arrangements and embodiments will become apparent to the skilled reader and accordingly the foregoing description is intended to be exemplary rather than restrictive.

I claim:

1. A synchronizer for synchronizing asynchronous transitions in a data signal with transitions in a clock signal and including a p-channel device and an n-channel device connected to a common node, the synchronizer being liable to metastability wherein a metastable voltage at said common node lingers at a level intermediate defined logic levels, said synchronizer including circuit means interposed between a first of said devices and said common node for shifting said metastable voltage at said common node substantially away from said intermediate level whereby to translate said metastable voltage at said common node to an unambiguous logic level.

2. A synchronizer as set forth in claim 1 wherein said circuit means comprises an additional device similar to said first of said devices.

3. A synchronizer for synchronizing asynchronous transitions in a data signal with transitions in a clock signal and including a first stack of p-channel transistors each having a control input, a second stack of n-channel transistors each having a control input, a common node between the first and second stacks, and means for applying a data signal to the control input of at least one transistor in each stack and applying a clock signal to the control input of at least one transistor in each stack, the synchronizer being liable to metastability wherein a metastable voltage at said common node lingers at a level intermediate defined logic levels, and synchronizer including means incorporated there within at least one of said stacks for shifting said metastable voltage at said node substantially away from said intermediate level whereby to translate said metastable voltage at said common node to an unambiguous logic level, wherein said means incorporate therewithin at least one of the stacks comprises an additional transistor in said at least one of the stacks.

* * * * *